US010802554B2

United States Patent
Lavy (10) Patent No.: US 10,802,554 B2
(45) Date of Patent: *Oct. 13, 2020

(54) COOLING ADAPTER FOR MOBILE DEVICE (71) Applicant: Nexar Ltd., Tel Aviv (IL)

(72) Inventor: Lev Yitzhak Lavy, Misgav Dov (IL)

(73) Assignee: Nexar, Ltd., Tel Aviv (IL)

( * ) Notice: Subject to any disclaimer, the term of this patent is extended or adjusted under 35 U.S.C. 154(b) by 0 days.

This patent is subject to a terminal disclaimer.

(21) Appl. No.: 16/450,521

(22) Filed: Jun. 24, 2019

(65) Prior Publication Data
US 2019/0310692 A1    Oct. 10, 2019

Related U.S. Application Data (63) Continuation-in-part of application No. 15/853,999, filed on Dec. 26, 2017, now Pat. No. 10,331,184.

(60) Provisional application No. 62/449,039, filed on Jan. 22, 2017.

(51) Int. Cl.
| | |
|---|---|
| *G06F 1/20* | (2006.01) |
| *H05K 7/20* | (2006.01) |
| *H04M 1/725* | (2006.01) |
| *H01R 13/66* | (2006.01) |
| *H01R 31/06* | (2006.01) |

(52) U.S. Cl.
CPC ............. *G06F 1/203* (2013.01); *H01R 13/66* (2013.01); *H01R 31/065* (2013.01); *H04M 1/72527* (2013.01); *H05K 7/20145* (2013.01)

(58) Field of Classification Search
CPC ......... H01L 2924/0002; H01L 2924/00; H01L 23/467; G06F 1/1632; G06F 1/20; G06F 2200/1635; H05K 7/20136; H05K 7/20209

USPC .... 361/679.56, 695, 679.48, 679.41, 679.32, 361/688, 690; 165/80.2; 439/119, 300
See application file for complete search history.

(56) References Cited

U.S. PATENT DOCUMENTS

| | | | | |
|---|---|---|---|---|
| 4,263,640 | A | * | 4/1981 | Altman ..................... F21S 4/22 362/227 |
| 5,667,009 | A | * | 9/1997 | Moore .................. E21B 17/003 166/65.1 |
| 6,307,746 | B1 | * | 10/2001 | Beckman ................ G06F 1/203 361/679.46 |
| 6,571,340 | B1 | * | 5/2003 | Lee ........................ G06F 1/1632 700/299 |
| 8,477,490 | B2 | | 7/2013 | Rothkopf et al. |
| 2006/0227516 | A1 | | 10/2006 | Huang et al. |
| 2007/0042637 | A1 | * | 2/2007 | Bell ....................... G06F 1/1632 439/502 |
| 2008/0086973 | A1 | | 4/2008 | Hallenstvet et al. |
| 2008/0267664 | A1 | | 10/2008 | Miyanagi et al. |
| 2009/0313790 | A1 | * | 12/2009 | Schau ..................... E05D 3/122 16/354 |
| 2011/0116225 | A1 | * | 5/2011 | Staben ...................... G06F 1/20 361/679.46 |
| 2011/0228471 | A1 | | 9/2011 | Humphrey et al. |

(Continued)

*Primary Examiner* — Mandeep S Buttar
(74) *Attorney, Agent, or Firm* — Soquel Group I.P Ltd.

(57) ABSTRACT

An adaptor for cooling a handheld electronic device, including a fan, an air socket, a first connector connecting the adaptor to a handheld electronic device, a second connector connecting the adaptor to a power source; a cable connecting the fan to the second connector, and a tube surrounding the cable, the tube being directed to an air conditioner, wherein the fan pushes cool air from the air conditioner to the handheld electronic device.

12 Claims, 6 Drawing Sheets

(56) References Cited

U.S. PATENT DOCUMENTS

2016/0223215 A1 8/2016 Buda et al.
2016/0381292 A1* 12/2016 Lu ................... H04N 5/23238
 348/36

* cited by examiner

COOLING ADAPTER FOR MOBILE DEVICE

CROSS REFERENCES TO RELATED APPLICATIONS

This application is a continuation-in-part of U.S. patent application Ser. No. 15/853,999, entitled COOLING ADAPTER FOR MOBILE DEVICE, and filed on Dec. 26, 2017 by inventor Lev Yitzhak Lavy, the contents of which are hereby incorporated herein in their entirety. U.S. patent application Ser. No. 15/853,999 is a non-provisional of U.S. Provisional Application No. 62/449,039, entitled COOLING ADAPTER FOR MOBILE DEVICE, and filed on Jan. 22, 2017 by inventor Lev Yitzhak Lavy, the contents of which are hereby incorporated herein in their entirety.

FIELD OF THE INVENTION

The present invention relates to cooling of handheld electronic devices such as smartphones to prevent excessive heat generation.

BACKGROUND OF THE INVENTION

Because of their high density and small size, modern electronic circuits generate a substantial amount of heat. Complex integrated circuits, especially microprocessors, generate so much heat that they are often unable to operate without a cooling system. Excess heat degrades an integrated circuit's performance and adversely affects its reliability over time. Inadequate cooling causes malfunction in central processing units of personal computers, and may result in system crashes, lockups, unexpected reboots, and other anomalies.

Personal computers have built-in cooling fans. However, smartphones and other handheld electronic devices do not have built-in fans. Moreover, the risk of malfunction is especially severe for the tight confines found inside smartphones and other handheld electronic devices. Heat management is critical as technology advances and newer devices become smaller and more complex, and run at higher power levels and power densities.

There are many use cases in which smartphones get overheated, including gaming, navigation and video conversations. It is common in these use cases for a smartphone to be connected to a charger, in order to avoid battery drainage, and the charging adds additional heat to the device. A smartphone that is not properly cooled reaches a temperature of 70° C.-90° C., which may cause the smartphone to shut down.

The danger of overheating is especially acute when a smartphone is used extensively outdoors or mounted on a dashboard of a car for use as a navigational tool, as a radio or as a video camera, on a hot and sunny day. Conventional approaches suggest use of an external cooling fan or a solar insulator. However, in the situations described above, it is not feasible to mount an external cooling fan near the smartphone since the fan would have to be transported with the smartphone outdoors, or would block a driver's vision if mounted on the dashboard of the car. A solar insulator would prevent only the sun's portion of the heating, but would fail to prevent internal heating.

As such, there is a need to attenuate heat generation for handheld electronic devices.

SUMMARY

Embodiments of the present invention provide apparatus and methods for cooling smartphones and other handheld electronic devices. Embodiments of the present invention provide cooling adaptors that plug into smartphones or other handheld electronic devices, and provide adequate cooling to prevent overheating.

Generally, the adaptor of the present invention includes a fan and an air socket that directs air flow to a handheld electronic device. One end of the adaptor connects to the handheld electronic device, and the other end of the adaptor includes a cable that connects to a source of power.

The adaptor comes in many variations that include different types of connectors, different types of cables, and different types of fans. The adaptor may include a vibration absorber, to absorb vibrations that would otherwise be transmitted from the fan to the handheld electronic device. The adaptor may include a sun reflector to block sunlight from penetrating the handheld electronic device. The adaptor may include one or more processing units, to offload some processing from the handheld electronic device. The adaptor may include a camera to capture image and/or video data. The adaptor may include a global positioning sensor. The adaptor may include an inertial measurement unit. The adaptor may include a temperature sensor. The adaptor may include an ammeter.

The adaptor may be packaged together with a cable, as an adaptor kit. The kit includes (i) a printed circuit board including a power chip, an air socket, and one or more connectors, (ii) a fan, (iii) a fan motor, and optionally (iv) other components.

There is thus provided in accordance with an embodiment of the present invention an adaptor for cooling a handheld electronic device, including a fan, an air socket, a first connector connecting the adaptor to a handheld electronic device, a second connector connecting the adaptor to a power source; a cable connecting the fan to the second connector, and a tube surrounding the cable, the tube being directed to an air conditioner, wherein the fan pushes cool air from the air conditioner to the handheld electronic device.

There is additionally provided in accordance with an embodiment of the present invention an adaptor for cooling a handheld electronic device, including a fan, an air socket, a charger, a connector connecting the adaptor to a handheld electronic device, a cable connecting the fan to the charger, and a tube surrounding the cable, the tube being connected to an air conditioner, wherein the fan pushes cool air from the air conditioner to the handheld electronic device.

BRIEF DESCRIPTION OF THE DRAWINGS

The present invention will be more fully understood and appreciated from the following detailed description, taken in conjunction with the drawings in which.

For reference to the figures, TABLE I provides an index of elements and their numerals. Similarly numbered elements represent elements of the same type, but they need not be identical elements.

TABLE I

Table of elements in the figures

| Element | Description |
| --- | --- |
| 100 | handheld electronic device |
| 150 | dashcam |
| 200A, 200B, 200C | adaptors |
| 210 | first connector |
| 220 | air socket |
| 230 | fan |
| 235 | flat fan |
| 240 | fan motor |
| 250 | cable |
| 251 | tube |
| 252 | clip |
| 260 | second connector |
| 270 | charger base |
| 280 | second connector |
| 290 | air flow |
| 300 | charger |
| 310 | optional camera |
| 320 | optional temperature sensor |
| 330 | optional rubber vibration absorber |
| 340 | optional GPS |
| 350 | air conditioner |
| 360 | optional sun reflector |

Elements numbered in the 1000's are operations of flow charts.

DETAILED DESCRIPTION

Embodiments of the present invention relate to adaptors for handheld electronic devices that provide adequate cooling and prevent overheating of the devices.

Figure 1:
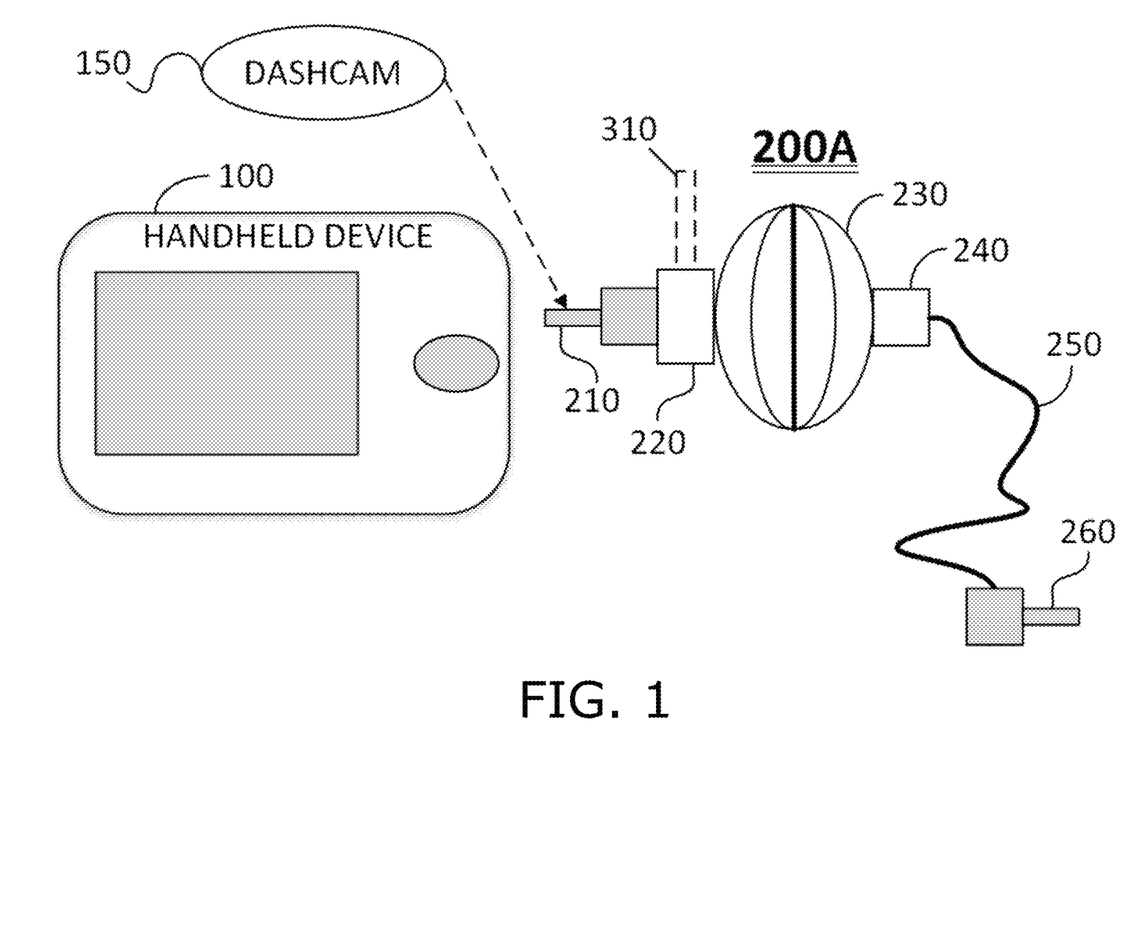
FIG. 1 is a simplified diagram of an adaptor for cooling a handheld electronic device, in accordance with a first embodiment of the present invention.

Reference is made to FIG. 1, which is a simplified diagram of an adaptor 200A for cooling a handheld electronic device 100, in accordance with a first embodiment of the present invention. Handheld electronic device 100 may be inter alia a smartphone, a media player, a gaming device, a navigational device, and an Internet of Things (IoT) device.

Adaptor 200A includes a first connector 210 connecting adaptor 200A to handheld electronic device 100, an air socket 220, a fan 230, a fan motor 240 that preferably runs on DC power, and a power cable 250 connecting fan motor 240 to a second connector 260. Cable 250 may include a USB cable, for charging from a car cigarette lighter.

First connector 210 may be a single connector that connects with a specific socket type of handheld electronic device 100. Alternatively, first connector 210 may include a connector bridge, such that multiple socket types may be connected thereto. In some embodiments of the present invention, first connector 210 may include a temperature sensor and/or an ammeter (not shown), and/or other sensors.

In some embodiments of the present invention, adaptor 200A may include a global positioning sensor and/or inertial measurement sensors 340. In other embodiments of the present invention, adaptor 200A may include a camera 310, to offload power and heat generating components from handheld electronic device 100. Data captured by camera 310 is processed and stored on handheld electronic device 100. Alternatively, data captured by camera 310 may be processed by a processing unit (not shown) that is part of adaptor 200A, and subsequently transmitted to handheld electronic device 100.

Alternatively, a dashboard camera ("dashcam") 150 may capture data and transmit the captured data to handheld electronic device 100 via first connector 210 using a wired or wireless connection.

Second connector 260 connects adaptor 200A to a USB port for charging. Alternatively, second connector 260 may connect adaptor 200A to one or more solar panels for charging.

Since fan 230 is part of adaptor 200A, it is not necessary to adjust the direction of handheld electronic device 100 in order to cool it.

The side of adaptor 200A connected to cable 250 may split internally, and thereby charge handheld electronic device 100 and also supply power to fan motor 240. Generally, fan 230 consumes up to 20% of the incoming power.

Adaptor 200A and cable 250 may be packaged together, as an adaptor kit. In one configuration, the kit includes (i) a printed circuit board containing first and second connectors 210 and 260, respectively, air socket 220, and a power chip, (ii) cable 250, (iii) fan 230, and (iv) fan motor 240.

Figure 2:
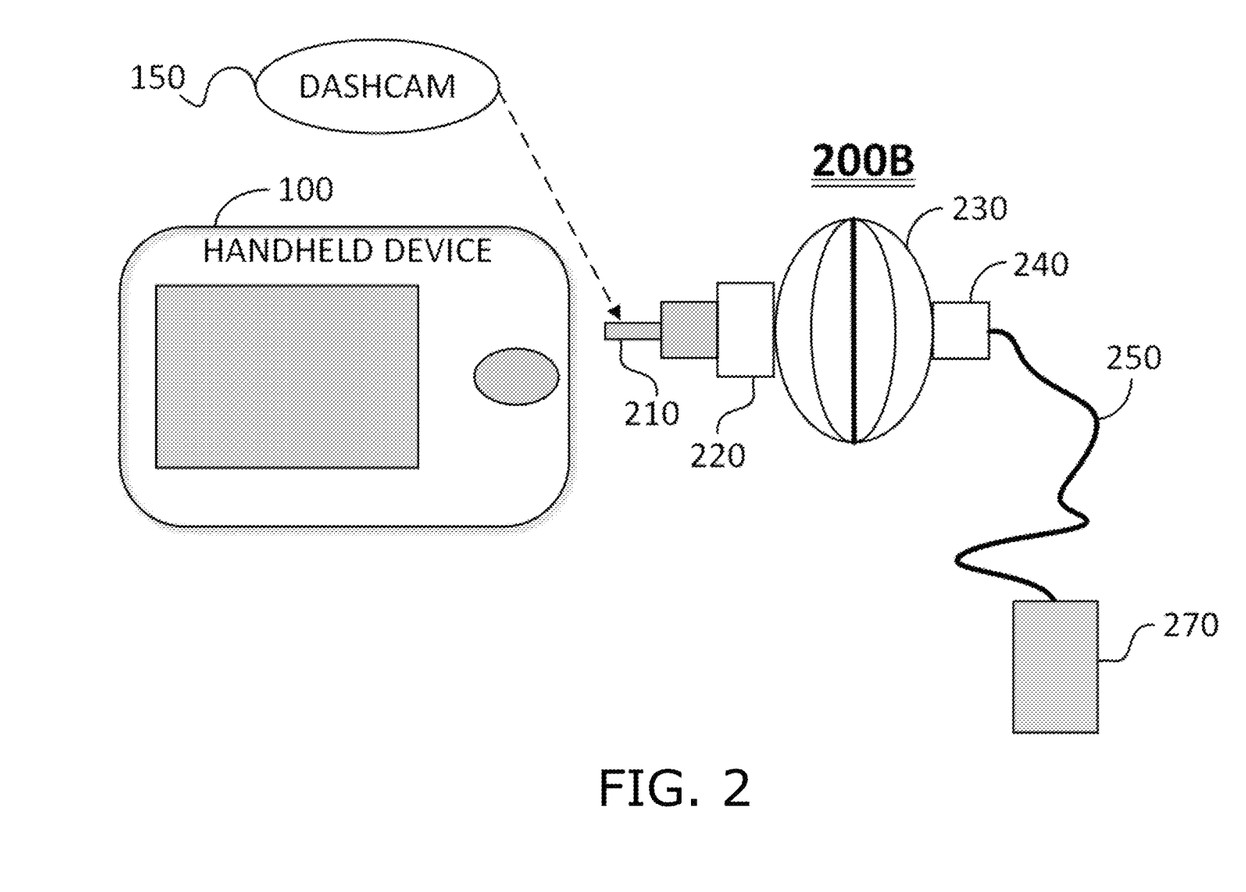
FIG. 2 is a simplified diagram of an adaptor for cooling a handheld electronic device, in accordance with a second embodiment of the present invention.

Reference is made to FIG. 2, which is a simplified diagram of an adaptor 200B for cooling handheld electronic device 100, in accordance with a second embodiment of the present invention. Adaptor 200B differs from adaptor 200A in that second connector 260 is absent, and cable 250 connects fan motor 240 to a charger base 270. Charger base 270 may connect to a car cigarette lighter, to an on-board diagnostics connector, or to a wall charger.

Adaptor 200B and cable 250 may be packaged together, as an adaptor kit. In one configuration, the kit includes (i) a printed circuit board containing first connector 210, air socket 220, and a power chip, (ii) cable 250, (iii) fan 230, (iv) fan motor 240, and (v) charger base 270.

Figure 3:
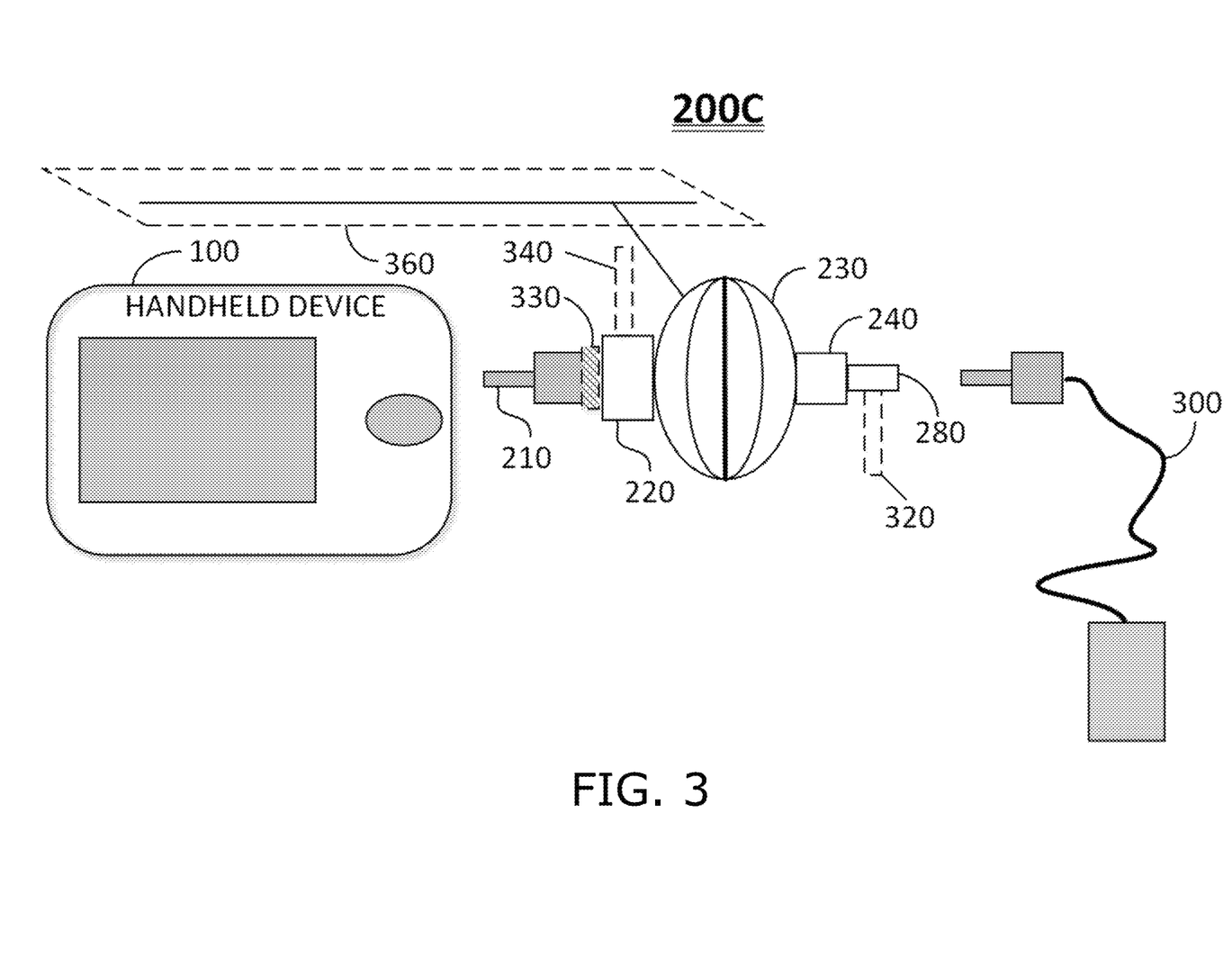
FIG. 3 is a simplified diagram of an adaptor for cooling a handheld electronic device, in accordance with a third embodiment of the present invention.

Reference is made to FIG. 3, which is a simplified diagram of an adaptor 200C for cooling handheld electronic device 100, in accordance with a third embodiment of the present invention. Adaptor 200C differs from adaptor 200B in that power cable 250 is absent, and a different second connector 280 is present. Second connector 280 is compatible with the power connector of handheld electronic device 100, and connects adaptor 200C to a handheld device charger 300.

In some embodiments of the present invention, second connector 260 or 280 is integrated with a temperature sensor 320, to sense the internal temperature of handheld electronic device 100. The speed of fan 230 is adjusted based on the output of temperature sensor 320, and may be controlled by the temperature sensor itself.

Adaptor 200C may be packaged as an adaptor kit. In one configuration, the kit includes (i) a printed circuit board containing first and second connections 210 and 260, respectively, air socket 220, and a power chip, (ii) charger 300, (iii) fan 230, and (iv) fan motor 240.

Figure 4:
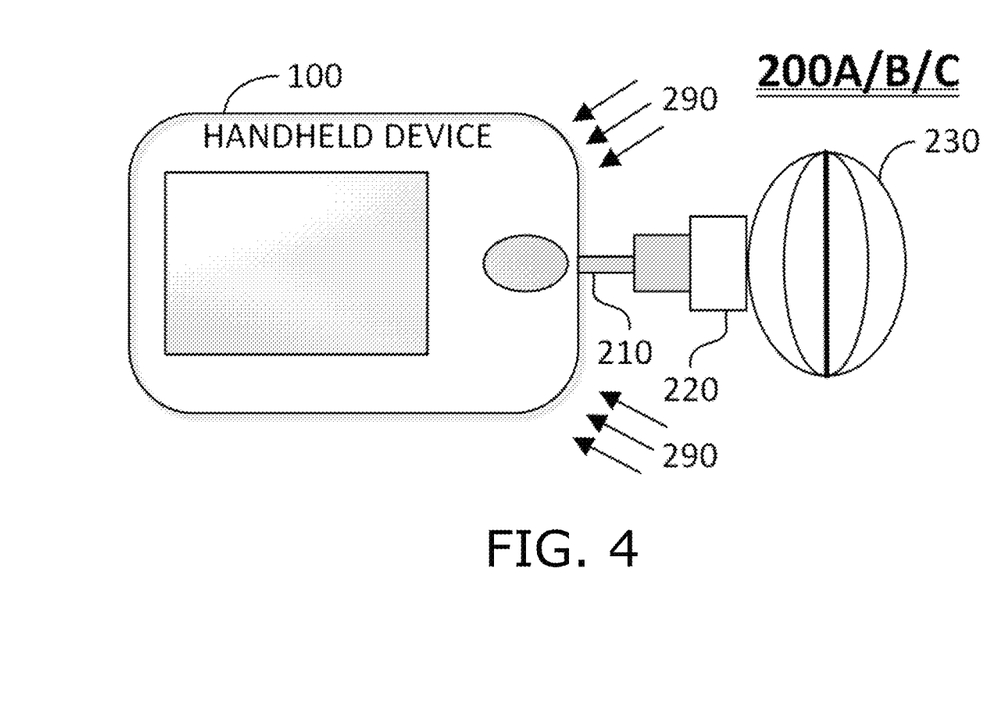
FIG. 4 is a simplified diagram of air flow from the adaptor of FIG. 1, FIG. 2 or FIG. 3, in accordance with an embodiment of the present invention.

Reference is made to FIG. 4, which is a simplified diagram of air flow 290 from adaptor 200A, 200B or 200C, in accordance with an embodiment of the present invention. FIG. 4 shows an embodiment where an air flow model redirects air on both sides of fan 230 so as to enter handheld electronic device 100 at an angle. In an alternative embodiment, the air flow arrives parallel to the surface of handheld electronic device 100, so as to provide a high temperature gradient between handheld electronic device 100 and the air, for efficient heat flow.

In some embodiments of the present invention, a vibration absorber 330, made of a soft rubber or other material, is mounted between connector 210 and fan 230. Vibration absorber 330 stabilizes handheld electronic device 100 to provide camera stability, and to reduce the effect of fan 230 vibrations on inertial measurement unit sensors in handheld electronic device 100.

In some embodiments of the present invention, adaptor 200A, 200B and 200C may include a sun reflector 360 connected to fan 230, to provide full or partial heat protection from sunlight.

In some embodiments of the present invention, adaptor 200A, 200B and 200C may include multiple fans for additional air flow control.

Figure 5:
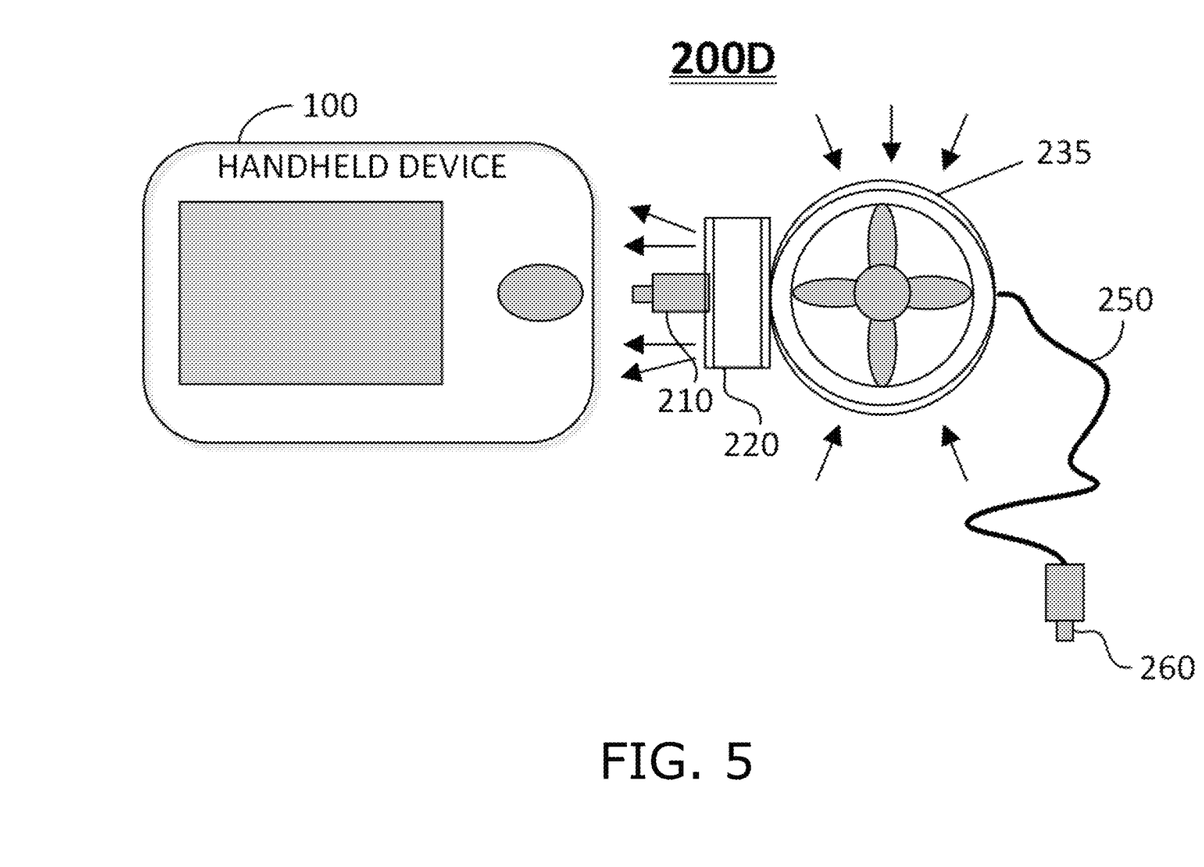
FIG. 5 is a simplified diagram of an adaptor for cooling a handheld electronic device, in accordance with a fourth embodiment of the present invention.

Reference is made to FIG. 5, which is a simplified diagram of an adaptor 200D for cooling handheld electronic device 100, in accordance with a fourth embodiment of the present invention. Adaptor 200D uses a flat fan 235, and is of particular advantage for handheld electronic devices 100 that have a flat surface with a display. Fan 235 is directed in front of or in back of the flat surface with the display. Fan 235 sucks air and pushes the air to air socket 220.

Figure 6:
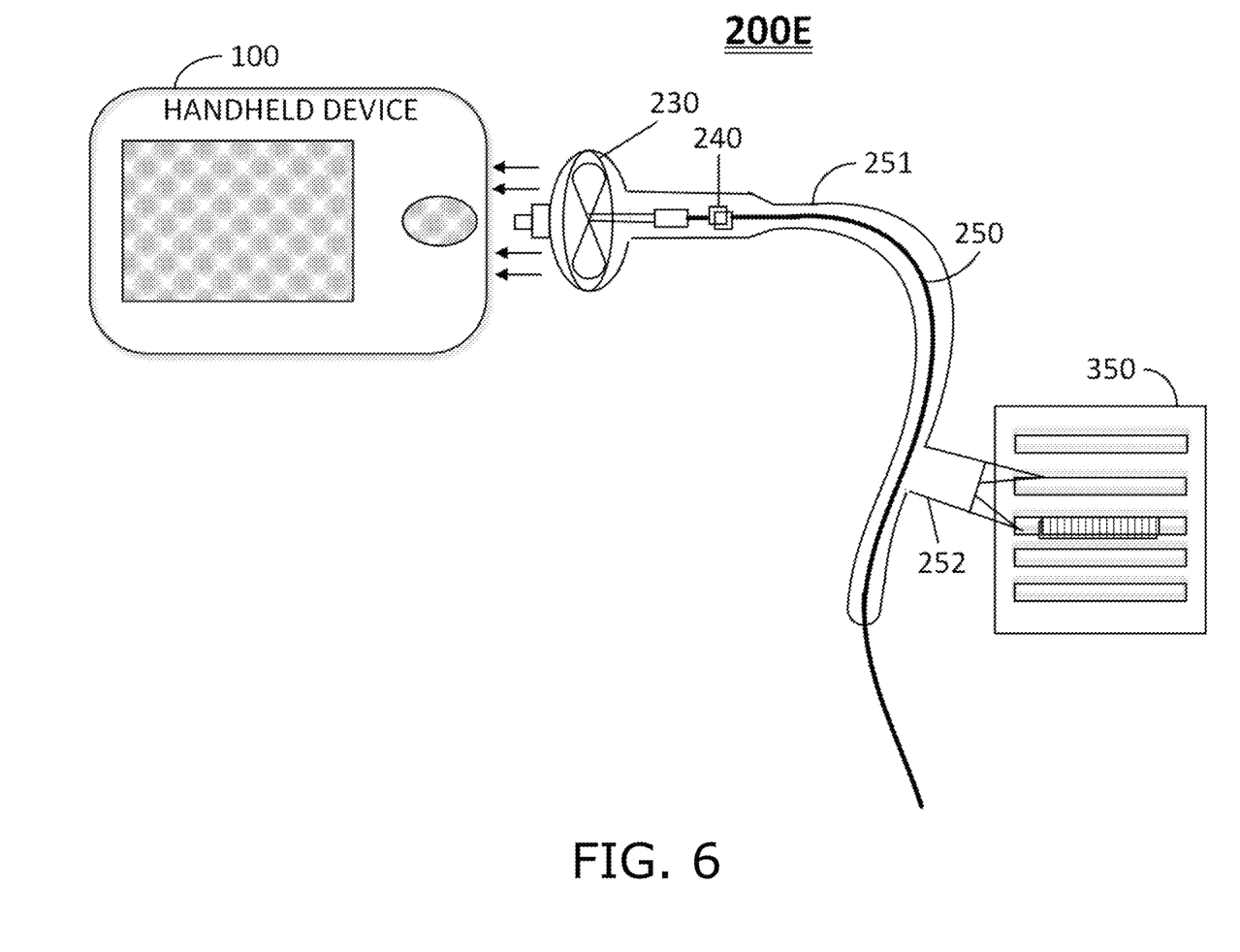
FIG. 6 is a simplified diagram of an adaptor for cooling a handheld electronic device, in accordance with a fifth embodiment of the present invention.

Reference is made to FIG. 6, which is a simplified diagram of an adaptor 200E for cooling handheld electronic device 100, in accordance with a fifth embodiment of the present invention. FIG. 6 shows a tube 251 surrounding cable 250, and a clip/magnet 252 that attaches tube 251 to a vehicle air conditioner 350. Fan 230 pushes cool air from air conditioner 350 directly to handheld electronic device 200.

Tube 251 may be fully rigid, fully flexible, partially rigid or partially flexible. Tube 251 may be fully transparent to reduce disturbance to a driver. Tube 251 may be directed away from vehicle air conditioner 350 when vehicle air conditioner 350 is providing heating. Temperature sensor 320 may be used to automatically sense when air conditioner 350 is providing heating, by tracking air flow being anti-correlated to cooling.

Although the discussion hereinabove relates to a handheld electronic device 100, it will be appreciated by those skilled in the art that the subject invention also applies to mobile devices that are not handheld.

The various embodiments of the adaptor described above may be combined in different ways. Thus flat fan 235 of FIG. 5 and/or tube 251 and clip/magnet 252 of FIG. 6 may be used with one another, and with any of adaptors 200A, 200B and 200C of FIGS. 1, 2 and 3, respectively.

In the foregoing specification, the invention has been described with reference to specific exemplary embodiments thereof. It will, however, be evident that various modifications and changes may be made to the specific exemplary embodiments without departing from the broader spirit and scope of the invention. Accordingly, the specification and drawings are to be regarded in an illustrative rather than a restrictive sense.

What is claimed is:

1. An adaptor for cooling a handheld electronic device, comprising:
   a fan;
   a first connector connecting the adaptor to a handheld electronic device;
   a second connector connecting the adaptor to a power source;
   a cable connecting said fan to said second connector; and
   a tube surrounding said cable, the tube being attached to an air conditioner, wherein said fan pushes cool air from the air conditioner to the handheld electronic device.

2. The adaptor of claim 1 wherein said tube is rigid.

3. The adaptor of claim 1 wherein said tube is flexible.

4. The adaptor of claim 1 wherein said tube is transparent.

5. The adaptor of claim 1 wherein said tube is directed away from said air conditioner when the air conditioner is providing heating.

6. The adaptor of claim 1 further comprising a dashcam streaming data to the handheld electronic device via said first connector using a wired or wireless connection.

7. An adaptor for cooling a handheld electronic device, comprising:
   a fan;
   a charger;
   a connector connecting the adaptor to a handheld electronic device;
   a cable connecting said fan to said charger; and
   a tube surrounding said cable, the tube being attached to an air conditioner, wherein said fan pushes cool air from the air conditioner to the handheld electronic device.

8. The adaptor of claim 7 wherein said tube is rigid.

9. The adaptor of claim 7 wherein said tube is flexible.

10. The adaptor of claim 7 wherein said tube is transparent.

11. The adaptor of claim 7 wherein said tube is directed away from said air conditioner when the air conditioner is providing heating.

12. The adaptor of claim 7 further comprising a dashcam streaming data to the handheld electronic device via said connector using a wired or wireless connection.

* * * * *